United States Patent
Yu et al.

(10) Patent No.: US 7,875,534 B2
(45) Date of Patent: Jan. 25, 2011

(54) REALIZING N-FACE III-NITRIDE SEMICONDUCTORS BY NITRIDATION TREATMENT

(75) Inventors: Chen-Hua Yu, Hsin-Chu (TW); Chia-Lin Yu, Sigang (TW); Ding-Yuan Chen, Taichung (TW); Wen-Chih Chiou, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/191,013

(22) Filed: Aug. 13, 2008

(65) Prior Publication Data

US 2010/0015787 A1    Jan. 21, 2010

Related U.S. Application Data

(60) Provisional application No. 61/082,428, filed on Jul. 21, 2008.

(51) Int. Cl.
*H01L 21/205* (2006.01)
(52) U.S. Cl. ............... 438/483; 438/775; 257/E21.108
(58) Field of Classification Search ............ 438/483, 438/775; 257/E21.108
See application file for complete search history.

(56) References Cited

U.S. PATENT DOCUMENTS

| | | | | |
|---|---|---|---|---|
| 4,448,633 | A * | 5/1984 | Shuskus | 438/767 |
| 6,294,016 | B1 * | 9/2001 | Kim et al. | 117/4 |
| 6,939,733 | B2 | 9/2005 | Shibata et al. | |
| 7,012,016 | B2 | 3/2006 | Gwo | |
| 7,135,716 | B2 | 11/2006 | Kim et al. | |
| 7,312,472 | B2 * | 12/2007 | Chiyo et al. | 257/79 |
| 7,338,828 | B2 | 3/2008 | Imer et al. | |
| 2005/0218419 | A1 * | 10/2005 | Okazaki et al. | 257/98 |
| 2006/0033120 | A1 * | 2/2006 | Hon et al. | 257/103 |
| 2006/0257626 | A1 | 11/2006 | Schlesser et al. | |
| 2007/0138499 | A1 * | 6/2007 | Sakurai | 257/103 |
| 2008/0121912 | A1 * | 5/2008 | McKenzie et al. | 257/98 |

OTHER PUBLICATIONS

Fichtenbaum, N. A., et al., "Electrical characterization of *p*-type N-polar and Ga-polar GaN grown by metalorganic chemical vapor deposition," Applied Physics Letters, 2007, 3 pgs., vol. 91, No. 17, American Institute of Physics.

Sumiya, M., et al., "Effect of treatments of sapphire substrate on growth of GaN film," Applied Surface Science, 2005, pp. 269-272, vol. 244, Science Direct.

Keller, S., et al., "Influence of the substrate misorientation on the properties of N-polar GaN films grown by metal organic chemical vapor deposition," Journal of Applied Physics, 2007, 6 pgs., vol. 102, No. 8, American Institute of Physics.

Fichtenbaum, N. A., et al., "Impurity incorporation in heteroepitaxial N-face and Ga-face GaN films grown by metalorganic chemical vapor deposition," Journal of Crystal Growth, 2008, pp. 1124-1131, vol. 310, Science Direct.

* cited by examiner

*Primary Examiner*—W. David Coleman
*Assistant Examiner*—Christine Enad
(74) *Attorney, Agent, or Firm*—Slater & Matsil, L.L.P.

(57) ABSTRACT

A method of forming a semiconductor structure includes providing a substrate; forming a buffer/nucleation layer over the substrate; forming a group-III nitride (III-nitride) layer over the buffer/nucleation layer; and subjecting the III-nitride layer to a nitridation. The step of forming the III-nitride layer comprises metal organic chemical vapor deposition.

15 Claims, 3 Drawing Sheets

US 7,875,534 B2

REALIZING N-FACE III-NITRIDE SEMICONDUCTORS BY NITRIDATION TREATMENT

This application claims priority to U.S. Provisional Patent Application Ser. No. 61/082,428, filed Jul. 21, 2008, and entitled "Realizing N-Face III-Nitride Semiconductors by Nitridation Treatment," which application is hereby incorporated herein by reference.

TECHNICAL FIELD

This invention relates generally to semiconductor device manufacturing processes, and more particularly to forming group-III nitride films, and even more particularly to forming group-III nitride films on silicon substrates.

BACKGROUND

Group-III nitride (often referred to as III-nitride, or III-N) compounds, such as gallium nitride (GaN) and its related alloys, have been under intense research in recent years due to their promising applications in electronic and optoelectronic devices. Particular examples of potential optoelectronic devices include blue light emitting diodes and laser diodes, and ultra-violet (UV) photo-detectors. The large bandgap and high electron saturation velocity of the III-nitride compounds also make them excellent candidates for applications in high temperature and high-speed power electronics.

Due to the high equilibrium pressure of nitrogen at typical growth temperatures, it is extremely difficult to obtain GaN bulk crystals. Owing to the lack of feasible bulk growth methods, GaN is commonly deposited epitaxially on substrates such as SiC and sapphire ($Al_2O_3$).

The existing GaN formation process, however, suffers from drawbacks. The conventional GaN films formed from a substrate are often Ga-faced, meaning that after the deposition of a GaN layer is finished, there is a gallium layer, although typically very thin, on top of the GaN layer. In the patterning of the GaN layer, this gallium layer must be patterned first. However, due to the significant difference in the etching characteristics between the gallium layer and the GaN layer, the etchant commonly used for patterning GaN layers, for example, KOH solution, may not be able to attack the gallium layer efficiently. Therefore, instead of using the wet etch that has a greater throughput, dry etch has to be used for patterning the GaN layer, resulting in reduced throughput.

One existing solution to solve the above-discussed problem is to perform a nitridation on the substrate, for example, a silicon substrate, before forming a buffer/nucleation layer (on which the GaN layer is formed). However, this method results in a silicon nitride layer being formed on the silicon substrate. Due to the amorphous structure of the silicon nitride layer, the crystalline structure of the subsequently formed GaN layer is adversely affected. Further, silicon nitride is not conductive, and hence bottom electrodes cannot be formed on the backside of the substrate.

An additional problem is that the GaN layer often has a relatively great concentration of nitrogen vacancies. This limits the carrier concentrations in p-type GaN films. Accordingly, a new method for forming GaN layers having improved reaction to etching, improved process flexibility, and improved carrier concentrations is needed.

SUMMARY OF THE INVENTION

In accordance with one aspect of the present invention, a method of forming a semiconductor structure includes providing a substrate; forming a buffer/nucleation layer over the substrate; forming a group-III nitride (III-nitride) layer over the buffer/nucleation layer; and subjecting the III-nitride layer to a nitridation. The step of forming the III-nitride layer comprises metal organic chemical vapor deposition.

In accordance with another aspect of the present invention, a method of forming a semiconductor structure includes providing a substrate; forming a buffer/nucleation layer over the substrate; forming a first group-III nitride (III-nitride) layer over the buffer/nucleation layer; and after the step of forming the first group-III nitride layer, performing a nitridation step.

In accordance with yet another aspect of the present invention, a method of forming a semiconductor structure includes providing a substrate; forming a buffer/nucleation layer over the substrate; forming a first group-III nitride (III-nitride) layer over the buffer/nucleation layer; after the step of forming the first III-nitride layer, performing a first nitridation step; forming an active layer over the first III-nitride layer; forming a second III-nitride layer over the active layer; and after the step of forming the second III-nitride layer, performing a second nitridation step.

The advantageous features of the present invention include the conversion of Ga-faced III-nitride layers to N-faced, so that wet etching may be used to pattern III-nitride layers. Furthermore, the nitrogen vacancies in the III-nitride layers may be reduced, resulting in increased carrier concentrations in the p-type III-nitride layers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming semiconductor structures comprising group-III nitride (often referred to as III-nitride, or III-N) compounds is provided. The intermediate stages of manufacturing preferred embodiments of the present invention are discussed. Throughout the various views and illustrative embodiments of the present invention, like reference numbers are used to designate like elements.

Figure 1:
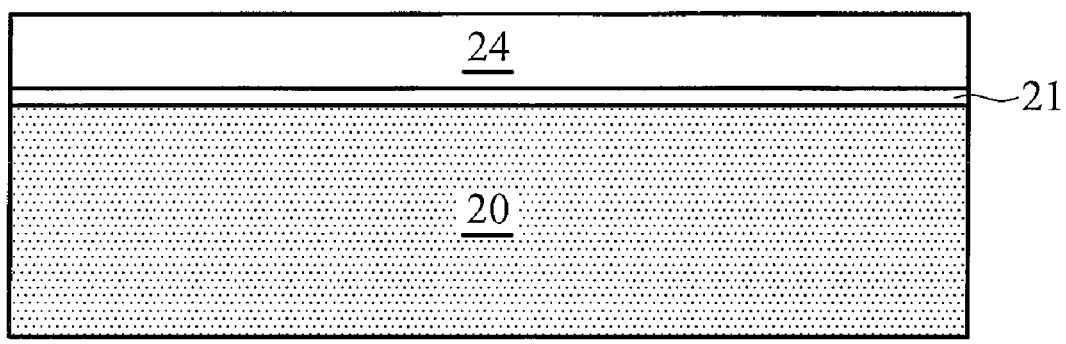
FIGS. 1 and 2 are cross-sectional views of intermediate stages in the manufacturing of an embodiment of the present invention, wherein the embodiment is formed on a conductive substrate.

Referring to FIG. 1, substrate 20 is provided. In an embodiment, substrate 20 is a conductive (or semi-conductive) substrate comprising GaN, Si, Ge, SiGe, SiC, ZnO, SnS, SnSe, GaP, GaAs, or combinations thereof. When substrate 20 is a silicon substrate, it preferably has a (111) surface orientation, although silicon substrates with other surface orientations such as (100) and (110) are also usable. In other embodiments, substrate 20 is a non-conductive substrate comprising sapphire ($Al_2O_3$), $MgAl_2O_4$, oxide mono-crystalline materials, or combinations thereof Substrate 20 may be a bulk substrate, or have a composite structure having layers formed of different materials.

Optionally, pre-seeding layer 21 is formed over, and may contact, substrate 20. Before the formation of pre-seeding layer 21, substrate 20 is preferably annealed to remove contamination. Pre-seeding layer 21 preferably comprises Al, Mg, Ga, In, Zn, and alloys thereof, and may be formed in a CVD chamber using precursors including metal such as Al, Mg, Ga, In, Zn, and the like.

Buffer/nucleation layer 24 is formed over pre-seeding layer 21. In an embodiment, buffer/nucleation layer 24 is formed of gallium nitride (GaN). In other embodiments, buffer/nucleation layer 24 includes other group-III nitrides, such as InN, AlN, and/or the like. In yet other embodiments, buffer/nucleation layer 24 has a superlattice structure. Superlattice buffer/nucleation layer 24 may include a plurality of InGaN thin layers and a plurality of GaN thin layers stacked in an alternating pattern, wherein the InGaN thin layers and the GaN thin layers preferably have substantially equal thicknesses. Alternatively, superlattice buffer/nucleation layer 24 may include a plurality of AlGaN thin layers and a plurality of GaN thin layers stacked in an alternating pattern. The formation of buffer/nucleation layer 24 includes metal organic chemical mechanical deposition (MOCVD), physical vapor deposition, molecular beam epitaxy (MBE), hydride vapor phase epitaxy (HVPE), liquid phase epitaxy (LPE), or other applicable deposition methods. Particularly, MOCVD is preferred for forming buffer/nucleation layer 24, in which metal-organic sources such as trimethyl-gallium (TMGa), trim-ethyl-indium (TMIn), trimethyl-aluminum (TMAl), bis-magnesium (Cp2Mg), and the like are used. Buffer/nucleation layer 24 may be formed at a relatively low temperature, for example, between about 550° C. and about 600° C., or a relatively high temperature between 1000° C. and 1200° C. Buffer/nucleation layer 24 may be doped with a p-type or an n-type impurity, or substantially un-doped. As a result, buffer/nucleation layer 24 may be of p-type, n-type, or substantially neutral.

In the preferred embodiment, after the formation of buffer/nucleation layer 24, a nitridation step is performed on buffer/nucleation layer 24. The nitridation may be performed in a thermal and/or plasma environment, with process gases including a nitrogen-containing gas such as $N_2$, a combined gas of $N_2$ and $H_2$, and/or $NH_3$ (ammonia). In an exemplary embodiment in which the thermal nitridation is performed, the temperature may be between about 700° C. and about 1200° C. Advantageously, the nitridation will convert the otherwise Ga-faced buffer/nucleation layer 24 (if it contains gallium) into an N-faced buffered layer. Furthermore, the formation of the N-faced buffered layer 24 may affect the subsequently formed III-nitride layers overlying buffer/nucleation layer 24, so that they will also be N-faced. As buffer/nucleation layer 24 is thin, the nitridation effect may be limited only in buffer/nucleation layer 24, so that a top layer of substrate 20 in contact with the buffer/nucleation layer 24 is not nitridated. Alternatively, the nitridation causes the top layer of substrate 20 to be nitrided also.

Figure 2:
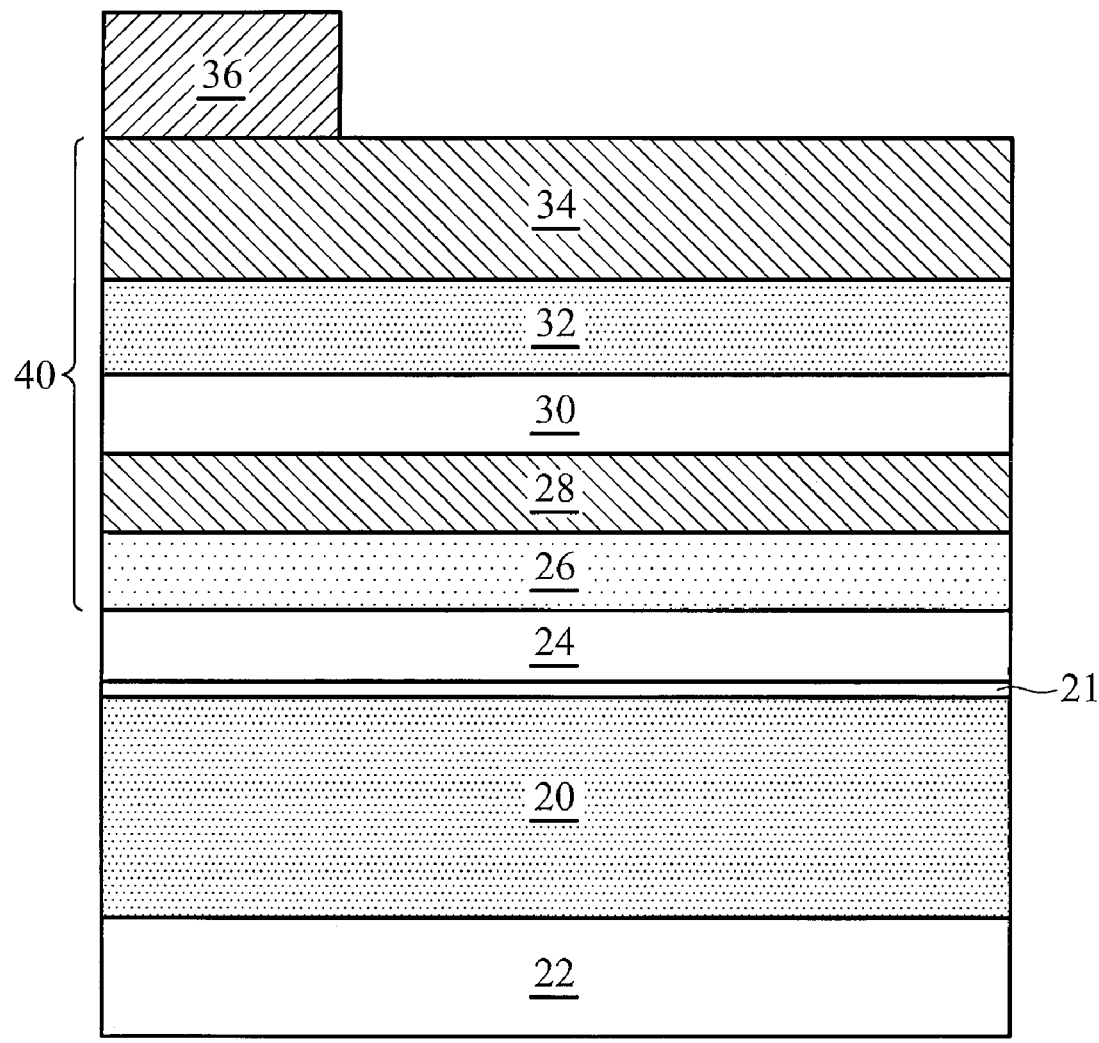

Next, III-nitride layers may be formed over buffer/nucleation layer 24. Referring to FIG. 2, first III-nitride layer 26 is formed on buffer/nucleation layer 24. In an exemplary embodiment, first III-nitride layer 26 is formed of GaN and is doped to p-type. First III-nitride layer 26 may be formed using MOCVD, MBE, HVPE, LPE, or the like, at a relatively high temperature, for example, about 1050° C. In other embodiments, first III-nitride layer 26 may be formed of p-type InN, p-type AlN, or the like.

Lower cladding layer 28 is formed over first III-nitride layer 26. In an exemplary embodiment, lower cladding layer 28 comprises AlGaN, and is doped to p-type. The formation methods of lower cladding layer 28 may be essentially the same as the method for forming first III-nitride layer 26.

Light-emitting layer 30 (also sometimes referred to as an active layer) is formed on lower cladding layer 28. In an exemplary embodiment, light-emitting layer 30 comprises undoped n-type gallium indium nitride ($Ga_xIn_yN_{(1-x-y)}$). In alternative embodiments, light-emitting layer 30 includes other commonly used materials such as $Al_xIn_yGa_{(1-x-y)}N$. In yet other embodiments, light-emitting layer 30 may be a multiple quantum well including multiple well layers (such as InGaN) and barrier layers (such as GaN) allocated in an alternating pattern. In yet other embodiments, light-emitting layer 30 is a double hetero-structure. Again, the formation methods include MOCVD, MBE, HVPE, LPE, or other applicable CVD methods.

Upper cladding layer 32 is formed on light-emitting layer 30. In an embodiment, upper cladding layer 32 comprises a material similar to that of lower cladding layer 28, such as AlGaN, except upper cladding layer 32 may be doped to n-type. The formation method of upper cladding layer 32 may be essentially the same as the method for forming lower cladding layer 28.

Next, a second III-nitride layer 34 is formed on upper cladding layer 32. The second III-nitride layer 34 may be formed of essentially the same or different materials, and using similar methods, as the formation of first III-nitride layer 26. The conductivity type of second III-nitride layer 34 is opposite to that of the first III-nitride layer 26.

In an embodiment, after the formation of first III-nitride layer 26, lower cladding layer 28, light-emitting layer 30, upper cladding layer 32, and/or second III-nitride layer 34, nitridation steps may be performed. The nitridation steps may be performed after the formation of each of the layers 26, 28, 30, 32, and 34, or performed after only one or some, but not all, of the layers 26, 28, 30, 32, and 34 in different combinations. The nitridation steps may also be performed only on p-type III-nitride layers such as layers 26 and 28, but not only on n-type III-nitride layers such as layers 32 and 34. The processes of the nitridation steps may be essentially the same as the nitridation performed on buffer/nucleation layer 24. In alternative embodiments, with the nitridation performed on buffer/nucleation layer 24, no additional nitridation step is performed on layers 26, 28, 30, 32, and 34. In yet other embodiments, no nitridation step is performed on buffer/nucleation layer 24, while at least one nitridation step is performed on at least one, and maybe all, of layers 26, 28, 30, 32, and 34.

After the formation of upper cladding layer 32, topside contact 36 is formed, and may be patterned. Topside contact 36 may be formed of an n-type ohmic material. In the resulting structure as shown in FIG. 2, first III-nitride layer 26, lower cladding layer 28, light-emitting layer 30, upper cladding layer 32, and second III-nitride layer 34 form optical device 40 (which may be a light-emitting diode or a photo diode), which emits or detects light when electrically activated. However, the above-discussed III-nitride layers may be used to form other optical devices, which are also in the scope of the present invention.

When substrate 20 is formed of a conductive material, or semi-conductive material such as silicon, substrate 20 is preferably doped with a p-type or n-type impurity, such as boron, indium, phosphorous, arsenic, or the like. Further, backside contact 22 may be formed on the backside of substrate 20. In an embodiment, backside contact 22 may be formed of the metal ohmic contact for substrate 20. A silicide layer (not shown) may be formed on the bottom side of backside contact 22. Alternatively, backside contact 22 includes an alloy such as aluminum-antimony alloy.

Please note that in the embodiments discussed in the preceding paragraphs, first III-nitride layer 26, lower cladding layer 28, upper cladding layer 32, and second III-nitride layer 34 may be formed of different combinations of materials including, but not limited to, InN, AlN, $InxGa_{(1-x)}N$, $AlxGa_{(1-x)}N$, and combinations thereof, and doped to desirable p-type or n-type. Further, there may be only one, but not both, of first III-nitride layer 26 and lower cladding layer 28. Similarly, there may be only one, but not both, of second III-nitride layer 34 and upper cladding layer 32.

In the embodiment discussed in the preceding paragraphs, an n-side up LED structure is discussed, wherein first III-nitride layer 26 and lower cladding layer 28 are referred to as being of p-type, and upper cladding layer 32 and second III-nitride layer 34 are referred to as being of n-type. In alternative embodiments, a p-side up LED structure is formed, in which first III-nitride layer 26 and lower cladding layer 28 are of n-type, and upper cladding layer 32 and second III-nitride layer 34 are of p-type.

Figure 3:
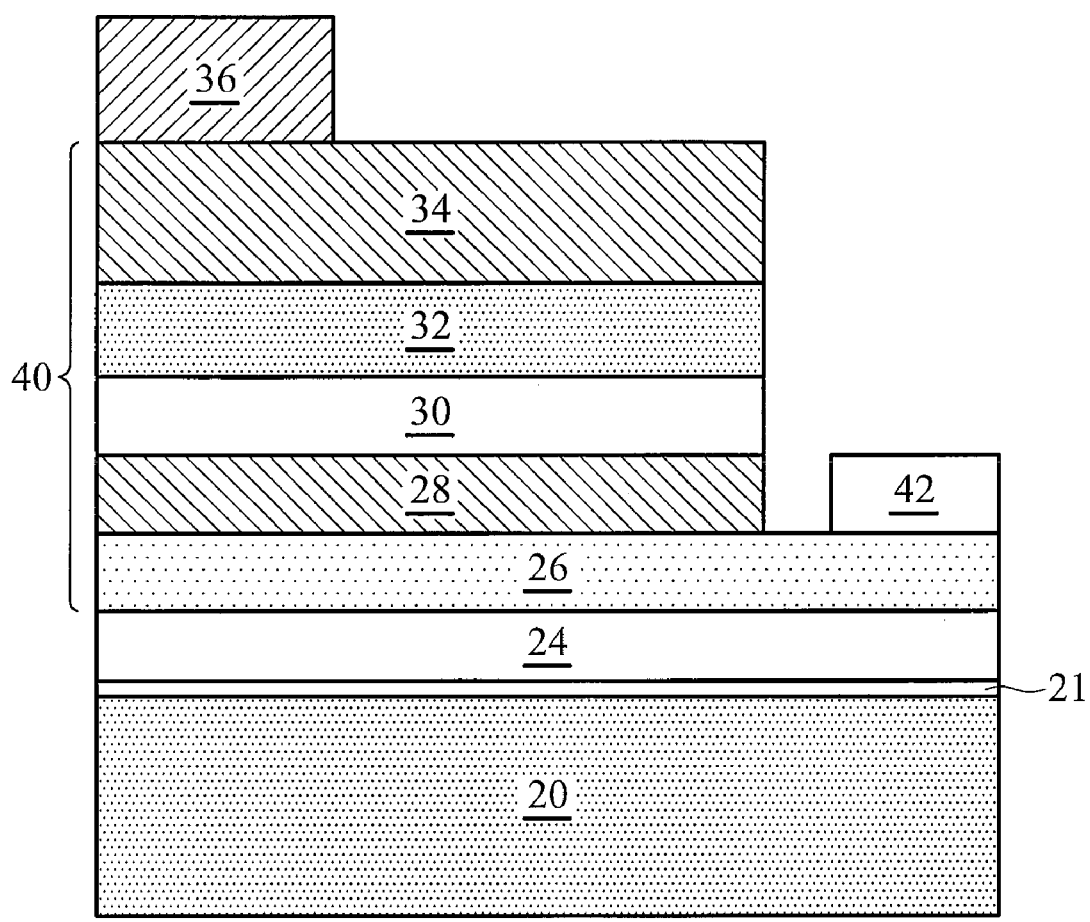
FIG. 3 illustrates an embodiment having a non-conductive substrate.

FIG. 3 illustrates a further embodiment of the present invention, which has an n-side down face-up structure. In this embodiment, substrate 20 is not conductive. Buffer/nucleation layer 24 may be a GaN layer formed at a low temperature, for example, about 550° C. to about 600° C. Again, MOCVD or other formation methods discussed in the preceding paragraphs may be used. First III-nitride layer 26, lower cladding layer 28, light-emitting layer 30, upper cladding layer 32, and second III-nitride layer 34 are formed on buffer/nucleation layer 24, using essentially the same methods as discussed in the preceding paragraphs. Since substrate 20 is non-conductive, bottom contact 42 is formed on the same side of substrate 20 as the topside contact 36. In this case, stacked layers 26, 28, 30, 32, and 34 need to be etched, preferably using wet etching for its relatively high throughput.

It is realized that the nitridation of layers 26, 28, 30, 32, and/or 34 has two functions. First, when the underlying buffer/nucleation layer 24 is Ga-faced, the overlying layers will also be Ga-faced if no nitridation is performed. The nitridation step(s) may convert the nitridated layer to N-faced. As a result, the III-nitride layers formed over the N-faced nitridated layer will also be N-faced. This results in the top III-nitride layer, for example, layer 34 in FIG. 2, to be N-faced. Accordingly, in the patterning of the III-nitride layers, there will be no gallium face layer to prevent the respective etching process, and wet etching (for example, using KOH solution) may be performed. Second, the nitridation steps performed on the III-nitride layers advantageously reduce the nitrogen vacancies in the III-nitride layers. Accordingly, for p-type III-nitride layers, the activation rate of the impurities may be improved, and carrier concentrations in these layers may be increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   providing a substrate;
   forming a buffer/nucleation layer over the substrate;
   after the step of forming the buffer/nucleation layer, performing a first nitridation step on the buffer/nucleation layer;
   forming a first group-III nitride (III-nitride) layer over the buffer/nucleation layer, wherein the first III-nitride layer is of p-type, and wherein no nitridation step is performed on the first III-nitride layer;
   forming a second III-nitride layer over the first III-nitride layer, wherein the second III-nitride layer is of n-type; and
   after the step of forming the second group-III nitride layer, performing a second nitridation step on the second group-III nitride layer.

2. A method of forming a semiconductor structure, the method comprising:
   providing a substrate;
   forming a buffer/nucleation layer over the substrate;
   forming a first group-III nitride (III-nitride) layer over the buffer/nucleation layer;
   after the step of forming the first III-nitride layer, performing a first nitridation step;
   forming a plurality of III-nitride layers, wherein the step of forming the plurality of III- nitride layers comprises forming an active layer;
   after each of the plurality of III-nitride layers is formed, performing an additional nitridation step;
   forming a second III-nitride layer over the plurality of III-nitride layers, wherein the step of forming the plurality of III-nitride layers is performed between the step of forming the first III-nitride layer and the step of forming the second III-nitride layer; and
   after the step of forming the second III-nitride layer, performing a second nitridation step.

3. The method of claim 1, wherein the first III-nitride layer contacts the buffer/nucleation layer.

4. The method of claim 1, wherein the first III-nitride layer is formed using metal organic chemical vapor deposition (MOCVD).

5. The method of claim 1, wherein the buffer/nucleation layer comprises a III-nitride material.

6. The method of claim 1 further comprising forming a diode, wherein the diode comprises the first III-nitride layer, and wherein the second nitridation step is performed after the step of forming the diode.

7. The method of claim 1, wherein the first and the second nitridation steps are performed by annealing the semiconductor structure in a nitrogen-containing environment.

8. The method of claim 1, wherein the first III-nitride layer comprises gallium nitride (GaN).

9. The method of claim 1 further comprising performing a wet etching on the first III-nitride layer.

10. The method of claim 1, wherein the step of performing the first nitridation step is performed before the step of forming the first III-nitride layer.

11. The method of claim 2, wherein the first and the second nitridation steps are performed by plasma annealing in an environment comprising a nitrogen-containing gas.

12. The method of claim 2, wherein the first and the second nitridation steps are performed by thermal annealing in an environment comprising a nitrogen-containing gas.

13. The method of claim 12, wherein the thermal annealing is performed at a temperature between about 700° C. and about 1200° C.

14. The method of claim 2, wherein the first nitridation step is performed using a process gas selected from the group consisting essentially of $N_2$, a combined gas of $N_2$ and $H_2$, $NH_3$, and combinations thereof.

15. The method of claim 2, wherein the step of forming the first III-nitride layer comprises metal organic chemical vapor deposition (MOCVD).

* * * * *